(12) United States Patent
Wertsberger et al.

(10) Patent No.: US 9,112,087 B2
(45) Date of Patent: Aug. 18, 2015

(54) WAVEGUIDE-BASED ENERGY CONVERTERS, AND ENERGY CONVERSION CELLS USING SAME

(71) Applicant: SOLARSORT TECHNOLOGIES, INC, Barrington, RI (US)

(72) Inventors: Shalom Wertsberger, Barrington, RI (US); Jeffrey C Andle, Falmouth, ME (US)

(73) Assignee: Shalom Wretsberger, Rochester, NY (US)

( * ) Notice: Subject to any disclaimer, the term of this patent is extended or adjusted under 35 U.S.C. 154(b) by 344 days.

(21) Appl. No.: 13/831,575

(22) Filed: Mar. 14, 2013

(65) Prior Publication Data

US 2014/0077322 A1    Mar. 20, 2014

Related U.S. Application Data

(60) Provisional application No. 61/701,687, filed on Sep. 16, 2012, provisional application No. 61/713,602, (Continued)

(51) Int. Cl.
*G01N 21/25* (2006.01)
*H01L 31/075* (2012.01)
(Continued)

(52) U.S. Cl.
CPC .......... *H01L 31/075* (2013.01); *G02B 6/12007* (2013.01); *G02B 6/1228* (2013.01); *Y02E 10/50* (2013.01)

(58) Field of Classification Search
CPC .. G02B 6/12007; G02B 6/1228; Y02E 10/50; H01L 31/075
USPC .......... 250/227.23, 214.1, 214 R; 385/33–36, 385/116, 900
See application file for complete search history.

(56) References Cited

U.S. PATENT DOCUMENTS 2,433,368 A    12/1947    Johnson et al.
3,112,404 A    11/1963    Reed
(Continued)

FOREIGN PATENT DOCUMENTS

DE    4409698    3/1994
GB    24584526    4/2012
(Continued)

OTHER PUBLICATIONS

"Plasmonic Rainbow Trapping Structures for Light Localization and Spectrum Splitting" Min Seok Jang and Harry Atwater, Physical Review Letters 107, 207401 (2011), Nov. 11, 2011, American Physical Society.

(Continued)

*Primary Examiner* — Seung C Sohn
(74) *Attorney, Agent, or Firm* — Shalom Wertsberger; CRTRix (57) ABSTRACT

A layered waveguide stack radiant energy converter array having a plurality of superposed waveguides, each waveguide having a core layer having a radiant energy converter disposed therein, and two cladding layers disposed on opposing sides of the core. In some embodiments the conductive layers are electrically coupled to the converter and act as charge carriers for it, and in other wires are provided for individual converters. Each waveguide has at least one inlet for passage of radiant energy therethrough, the inlet extending between the cladding layers, such that radiant energy entering the waveguide impinges on at least two layers of the waveguide, the inlet further defining a minimum cutoff frequency for the energy to propagate in the waveguide. In some embodiments such as solar panels, energy is harvested. In other embodiments energy is detected such as for example is done in a camera focal plane sensor. In some embodiments the stack is used to emit light.

20 Claims, 7 Drawing Sheets

Related U.S. Application Data filed on Oct. 14, 2012, provisional application No. 61/718,181, filed on Oct. 24, 2012, provisional application No. 61/723,832, filed on Nov. 8, 2012, provisional application No. 61/723,773, filed on Nov. 7, 2012, provisional application No. 61/724,920, filed on Nov. 10, 2012.

(51) Int. Cl.
  G02B 6/12    (2006.01)
  G02B 6/122   (2006.01)

(56) References Cited

U.S. PATENT DOCUMENTS

| | | | |
|---|---|---|---|
| 3,310,439 A | | 3/1967 | Seney |
| 3,422,527 A | | 1/1969 | Gault |
| 4,251,679 A | | 2/1981 | Zwan |
| 4,332,973 A | | 6/1982 | Sater |
| 4,409,422 A | | 10/1983 | Sater |
| 4,842,357 A | * | 6/1989 | Doneen .................... 385/12 |
| 5,923,795 A | | 7/1999 | Toyohara |
| 5,930,433 A | | 7/1999 | Williamson et al. |
| 6,323,833 B1 | | 11/2001 | Takeuchi |
| 6,328,932 B1 | * | 12/2001 | Carter et al. ............ 422/82.06 |
| 7,397,977 B2 | * | 7/2008 | Hashimoto et al. .......... 385/14 |
| 7,799,988 B2 | | 9/2010 | Cutler |
| 7,902,453 B2 | | 3/2011 | Dutta |
| 7,943,847 B2 | | 5/2011 | Kempa et al. |
| 7,999,174 B2 | | 8/2011 | Moslehi |
| 2005/0207699 A1 | | 9/2005 | Painter et al. |
| 2008/0047601 A1 | | 2/2008 | Nag et al. |
| 2009/0199893 A1 | | 8/2009 | Bita et al. |
| 2009/0301549 A1 | | 12/2009 | Moslehi |
| 2010/0155602 A1 | | 6/2010 | Scherer et al. |
| 2010/0202734 A1 | | 8/2010 | DeCorby |
| 2012/0006382 A1 | | 1/2012 | Dagli et al. |
| 2012/0135512 A1 | | 5/2012 | Vasylyev |

FOREIGN PATENT DOCUMENTS

| | | |
|---|---|---|
| JP | 2003224249 | 1/2002 |
| WO | WO9210014 | 6/1992 |
| WO | WO00/04406 | 1/2000 |
| WO | WO2010076791 | 7/2010 |

OTHER PUBLICATIONS

"DOE Solar Energy Technologies program Peer Review" Harry A. Attwater, Nathan S. Lewis, Mar. 9-10, 2009 Denver, CO, US Department of Energy.

"Multi-Bandgap High Efficiency Converter (Rainbow)", Carol R. Lewis **, Wayne M. Phillips, Virgil B. Shields and Paul M. Stella, Ivan Bekey, Jet Propulsion Laboratory, Pasadena, California Institute of Technology.

"Trapping a Rainbow: Researchers Slow Broadband Light Waves With Nanoplasmonic Structures", Science Daily Mar. 15, 2011, www.sciencedily.com /releases/2011/03/110314152921.htm.

"Visible-band dispersion by a tapered air-core Bragg waveguide" B. Drobot, A. Melnyk, M. Zhang, T.W. Allen, and R.G. DeCorby, Oct. 8, 2012 / vol. 20, No. 21 / Optics Express 23906, ©2012 Optical Society of America.

Extraordinary optical transmission through metal films with sub wavelength holes and "slits" , A. S. Vengurlekar, Tata Institute of Fundamental Research, Mumbai 400005, MS Completed in Oct. 2009, to appear in Current Science, J. of Ind. Acad. Science.

"Efficiency and finite size effects in enhanced transmission through subwavelength apertures", F. Przybilla, A. Degiron, C. Genet, T.W. Ebbesen, F. de L'eon-P'erez, J. Bravo-Abad, F. J.Garc'ia-Vidal, L. Mart'in-Moreno. Jun. 23, 2008 / vol. 16, No. 13 / Optics Express 9571, © 2008 Optical Society of America.

Nanoscale Devices for Rectification of High Frequency Radiation from the Infrared through the Visible: A New Approach N. M. Miskovsky, P. H. Cutler, A. Mayer, B. L. Weiss, Brian Willis, T. E. Sullivan, and P. B. Lerner Copyright © 2012 N. M. Miskovsky et al. Journal of Nanotechnology vol. 2012 (2012), Article ID 512379.

"Light transmission through perforated metal thin films made by island lithography", Mino Green, Futing Yi, 2004 Elsevier B.V. Available online Jul. 2, 2004.

"Trapping light in plasmonic waveguides", Junghyun Park, Kyoung-Youm Kim, Il-Min Lee, Hyunmin Na, Seung-Yeol Lee, and Byoungho Lee, Jan. 18, 2010 / vol. 18, No. 2 / Optics Express 598, ©2010 Optical Society of America.

"Stopping light by an air waveguide with anisotropic metamaterial cladding" Tian Jiang, Junming Zhao and Yijun Feng, Jan. 5, 2009 / vol. 17, No. 1 / Optics Express 170, © 2008 Optical Society of America.

"Light transmission through a single cylindrical hole in a metallic film" F. J. Garc'ia de Abajo Dec. 2002 / vol. 10, No. 25 / Optics Express 1475 © 2002 Optical Society of America.

"Transmission of light through thin silver films via surface plasmon-polaritons", Armando Giannattasio, Ian R. Hooper, and William L. Barnes. Nov. 29, 2004 / vol. 12, No. 24 / Optics Express 5881, © 2004 Optical Society of America.

"Experimental verification of the "rainbow" trapping effect in plasmonic graded gratings" Qiaoqiang Gan, Yongkang Gao, Kyle Wagner, Dmitri V. Vezenov, Yujie J. Ding, and Filbert J. Bartoli.

"Photonic Design Principles for Ultra High Efficiency Photovoltaics" Albert Polman and Harry Atwater, Nature Materials Mar. 2012, vol. 11, 174-177, (c) Macmillan Publishers LTD.

"A different Dimension, PV cell designed to be a 'predator of light' is targeting huge boost in efficiency", Darius Snieckus, www.rechargenews.com, Feb. 4, 2011.

"Surface-plasmon-assisted resonant tunneling of light through a periodically corrugated thin metal film", Ivan Avrutsky, Yang Zhao, and Vladimir Kochergin, May 1, 2000 / vol. 25, No. 9 / Optics Letters 595-597, (c) 2000 Optical Society of America.

"Let the Light in, 3D solar cell technologies" PV Magazine Oct. 2012.

US Office action in sibling U.S. Appl. No. 13/685,691, Mar. 4, 2013.
Examination report in UK sibling application GB 1222557.9 Feb. 1, 2013.

"'Trapped rainbow' storage of light in metamaterials" ,Kosmas L Tsakmakidis, Allan D. Boardman & Ortwin Hess, Nature vol. 450, DOIJK 10.1038/Nature 06285, Nov. 15, 2007, Nature Publishing Group 2007.

\* cited by examiner

WAVEGUIDE-BASED ENERGY CONVERTERS, AND ENERGY CONVERSION CELLS USING SAME

FIELD OF THE INVENTION

The present invention relates generally to radiant energy converters for converting radiant energy to electrical energy, and more particularly to radiant energy converters within waveguides.

BACKGROUND OF THE INVENTION

In solar power systems, energy is obtained by directly harnessing the electromagnetic solar radiation from the sun. The total solar radiation incident on the earth far exceeds the total power requirements well into the future and offers a viable offset to fossil fuels. Significant effort has been directed to higher utilization of solar energy but efficiency, space, and cost considerations have hampered this effort to date.

In applications such as digital photography, having a single focal-plane image array sensor, which can sense a broad spectrum is highly desirable. While sensing from Ultra Violet (UV), through the visible spectrum, and into the near and far infra red (IR) is required only for special applications, smaller spectral ranges of interest may be advantageously utilized.

The ability to provide light energy with controlled polarization is also desirable in the field of displays, to provide stereoscopic illusion of 3 dimensional space, colloquially related to as 3D.

Millimeter waves are radiant energy waves ranging from 30-300 GHz are used for detecting material differentiation purposes, and as a portion of hyperspectral imaging. The structures disclosed herein provide ability to detect or emit such waves with adaptations such as material selection and proper dimensioning. The term 'radiant energy' as used herein covers a very broad spectrum of radiation ranging from the Extremely High Frequency (EHF) with sub millimeter wavelength through the Infra Red (IR) and the visible spectrum, to the Ultra Violet (UV) at merely a few hundred nanometers. Oftentimes specific applications would be required to cover only portions of this spectrum, which forms their spectral range of interest. By way of example, for solar energy applications the spectral range of interest will likely be a spectrum containing most if not all of the solar spectrum available at the location where the solar cell is to be deployed, or the portion thereof which is economically used by the device at hand, typically 3 μm to 300 nm for example. The spectral range of interest for most display devices is within the visible light, even if some special application demand extending the spectral range. In some applications a specific wavelength may be desirably attenuated, such as by way of example reduction of blue light for aviation related devices. Yet, for devices directed to heat energy recovery, it is likely that only the infra-red portion of the spectral range is of interest. Similarly, the spectral range of interest may be applicable to portions of a device, for example a device may be directed to a broad spectrum, but portions thereof may be directed to a narrower spectrum, and the spectral range of interest is thus limited to the range of interest of the portion of the device. By way of a non-limiting example a television may occupy a display portion with a spectral range of interest including the visible range, while the device as a whole includes the aural range as well. It is seen therefore that the application at hand determines the spectral range of interest for which an apparatus utilizing the invention is directed to.

Therefore, the spectral range of interest is defined as relating to any portion or portions of the total available spectrum of frequencies which is being utilized by the application and or apparatus at hand, and which is desired to be detected and/or emitted utilizing the technologies, apparatuses, and/or methods of the invention(s) described herein, or their equivalents. The term spectral components as used herein means a portion of a broader spectrum, spatially separated from the broader spectrum by frequency and/or polarization.

The present invention is applicable to a very broad range of applications, and is selectively operational over a very broad spectrum of electromagnetic radiant energy, extending at least from the EHF to the UV, or any suitable spectral bands or domains. Therefore, for brevity and simplicity of expression, these specifications would relate to one example of the spectral range of interest, namely light, interchangeably with, and to denote, the spectrum described above, or portions thereof. Where specific constructs or conditions are more befitting specific portions of the spectrum such mention may be made. Similarly, terms such as optical, transparent, reflective, refractive and the like, should be construed to mean the appropriate equivalent terms befitting the specific portion of the spectrum at hand.

Structure to facilitate conversion of radiant energy to electricity or electrical signals (hereinafter "LE"), or conversion of electrical signals into radiant energy such as light (hereinafter "EL") are known. Collectively, objects, materials, and structures which perform such conversion are referred to hereinunder as 'converters'. By way of non-limiting examples, the term "converter" relates to light sources, light emitters, light modulators, light sensors, photovoltaic materials including organic and inorganic converters, quantum dots, photonic structures, and the like, CCD and CMOS structures, LEDs, OLEDs, LCDs, receiving and/or transmitting antennas and/or rectennas, phototransistors photodiodes, diodes, electroluminescent devices, fluorescent devices, gas discharge devices, electrochemical converters, and the like. The skilled in the art would recognize that certain LE converters may act as EL converters, and vice versa, with proper material selection, so a single converter may operate both as EL and LE converter, depending on the manner of operation. Alternatively converters may be built to operate only as LE or as EL converters. Furthermore, different types of converters may be employed in any desired combination, so the term converters may imply any combinations of LE and EL, as required by the application at hand.

Presently the most common structures for LE conversion are photovoltaic (PV) solar cells which generally use layers of different materials. In a PN based converter, a PN junction is formed at the interface of a positive and negative doped semiconductor materials, such as silicon. When exposed to a photon having energy equaling or higher than the band gap between the junction materials, the photon energy causes formation of electron-hole groups, which are separated and collected on both sides of the junction depletion zone.

Yet another class of converters employs polymer based photoabsorptive material as electron donors in combination with electron acceptors. In some cases the resulting excited electron is separated from the corresponding hole using different work function conductors. In other cases, a polymer electron acceptor forms a heterojunction with the electron donor. Such converters generally are less expensive than PV converters, but have lower efficiency therefrom; however, their efficiency may be significantly advanced by aspects of the present invention. Notably, the PN junction of semiconductor-based converters is treated as comprising electron acceptor and electron donor materials respectively, regardless of the actual mechanism by which charges are separated therein.

Other types of converters utilize antennas, and more commonly rectennas, to achieve the energy conversion. The term rectenna relates to an antenna structure having a rectifier integrated with, or closely coupled to, the antenna, such that electromagnetic energy incident on the antenna is rectified and presented as primarily unidirectional (ideally DC) signal. By way of example, rectennas are described in U.S. Pat. No. 7,799,998 to Cutler, and in "Nanoscale Devices for Rectification of High Frequency Radiation from the Infrared through the Visible: A New Approach", N. M. Miskovsky, P. H. Cutler, A. Mayer, B. L. Weiss, BrianWillis, T. E. Sullivan, and P. B. Lerner, Journal of Nanotechnology, Volume 2012, Article ID 512379, doi:10.1155/2012/512379, Hindawi Publishing Corporation©. which is incorporated herein by reference in its entirety.

LE converters typically employ a broad-band collector. Photovoltaic converters are high pass collectors in that all energy above a critical cutoff frequency is converted. However, the photon energy in excess of the band gap energy is converted to heat. Rectenna converters attempt to employ broad-band antennas with rectifiers. Their operating frequency is limited by the characteristics of the rectifier and by the bandwidth of the antenna. However, converters generally exhibit a frequency dependent optimum efficiency, which is commonly also affected by temperature.

Waveguides are a known structure for trapping and guiding electromagnetic energy along a predetermined path. An efficient waveguide may be formed by locating a layer of dielectric or semiconducting material between cladding layers on opposite sides thereof. The cladding may comprise dielectric material or conductors, commonly metal. Waveguides have a cutoff frequency, which is dictated by the wavelength in the waveguide materials, and the waveguide width. As the frequency of the energy propagating in the waveguide approaches the cutoff frequency $F_c$, the energy propagation speed along the waveguide is slowed down. The energy propagation of a wave along a waveguide may be considered as having an angle relative to cladding. This angle is determined by the relationship between the wavelength of the wave and the waveguide width in the dimension in with the wave is being guided. If the width of the waveguide equals one half of the wave wavelength, the wave reaches resonance, and the energy propagation along the waveguide propagation axis stops. The condition where energy is at or close to such resonance will be termed as a stationary resonant condition.

In these specifications "semiconductor" will be used to denote a photovoltaicly active material, having a bandgap comparable to or smaller than the photon energy of any photon in the spectrum of interest to a specific application.

In contrast, a transparent conductor is a material having a comparatively small but meaningful conductivity due to a partially filled conduction band or partially empty valence band but having a band-gap between the valence band and conduction band exceeding the energy of any photon in the spectrum of interest. These materials act like a dielectric at high frequencies but act like a conductor at low frequencies. Transparent dielectric materials also have low optical losses such that photons efficiently transmit through such material, at least at the spectrum of interest or a significant portion thereof.

While transparent conductors may be considered as wide bandgap semiconducting materials, they are used as conductors in most applications. Dielectrics, transparent conductors, and semiconductors, as used in these specifications, refer to materials that have a dielectric constant at optical frequencies; however, the distinction between a semiconductor and the remaining materials is that the bandgap of a semiconductor is not substantially larger than the photon energy. As a general and non-limiting guideline, table 1 describes several characteristics of the different conductive, insulating, and semi-conductive materials.

TABLE 1

| | Material | | | |
|---|---|---|---|---|
| | Metal | Trans. Cond. | Semi-conductor | Dielectric |
| Bandgap | →0 | >>photon | ≤photon | >>photon |
| DC Conductivity | high | good | Varies | →0 |
| Optical Property | reflective | transparent | absorptive | transparent |
| Dielectric constant | complex | low loss | lossy | low loss |

Radiant energy converters typically employ normal incidence of radiant electromagnetic energy onto a detection structure. Normal incidence has the limitation of a comparatively small probability of being utilized for energy conversion before being transmitted through the collection layer. Energy transmitted through the collection layer is, at best, lost and, at worst, converted to heat in the supporting substrate. Several attempts have been made to provide converters that use "side illumination" in which the light is inserted from the side of the junction. Such examples include, inter-alia, in U.S. Pat. No. 3,422,527 to Gault, U.S. Pat. No. 3,433,677 to Robinson, and U.S. Pat. No. 4,332,973 to Sater.

Prisms and other refractive devices can be used to improve incidence angles, and to direct different frequencies of radiant energy to different regions of a converter, where each region is optimized for a target frequency. U.S. Pat. No. 7,888,589 to Mastromattteo and U.S. Pat. No. 8,188,366 to Hecht, disclose examples of such devices.

Continuous Resonant Trap refractors (CRTR) and lateral waveguides (generally referred to in these specification as 'stacked waveguides') were first disclosed in U.S. Provisional Patent Application 61/701,687, titled "Continuous Resonant Trap Refractor, Waveguide-based Energy Converters, Energy Conversion Cells, and Display Panels Using Same" filed Sep. 16, 2012. Applications of CRTR structure and lateral waveguides, and further refinements thereto are disclosed in U.S. Patent Applications 61/713,602, titled "Image Array Sensor"; 61/718,181, titled "Nano-Scale Continuous Resonance Trap Refractor"; 61/723,832, titled "Pixel Structure Using Tapered Light waveguides, Displays, Display Panels, and Devices Using Same"; 61/723,773, titled "Optical Structure for Banknote Authentication"; Ser. No. 13/726,044 titled "Pixel Structure Using Tapered Light waveguides, Displays, Display Panels, and Devices Using Same"; Ser. No. 13/685,691 titled "Pixel structure and Image Array Sensors using same"; all to Andle and Wertsberger; and U.S. provisional Patent Application 61/724,920, titled "Optical Structure for Banknote Authentication, and Optical Key Arrangement for Activation Signal Responsive to Special Light Characteristics", to Wertsberger. Each of the above identified Patent Applications is incorporated herein by reference in its entirety.

There is therefore a clear, and heretofore unanswered, need for higher efficiency converters and converter arrangements for converting radiant energy to electrical energy, and vice versa. The present invention aims to provide such a solution.

SUMMARY OF THE INVENTION

It is therefore an object of the present invention to provide devices and technology to increase the energy efficiency of a radiant energy conversion cell which is relatively inexpensive, easy to manufacture, and which does not significantly increase the surface dimensions or weight of the cell so as to adversely effect its usability. It is also an object of the present invention to provide compact and efficient conversion elements to allow conversion of electrical energy to radiant energy.

Therefore, there is provided a layered waveguide stack radiant energy converter array comprising a plurality of superposed waveguides, each waveguide comprising a core layer having a radiant energy converter disposed therein, and two conductive cladding layers disposed on opposing sides of the core layer, the conductive layers being electrically coupled to the converter and acting as charge carriers for it; each waveguide having at least one inlet for passage of radiant energy therethrough, the inlet extending between the cladding layers, such that radiant energy entering the waveguide impinges on at least two layers of the waveguide, the inlet further defining a minimum cutoff frequency for the energy to propagate in the waveguide.

Preferably, at least one converter comprises an electron donor region and an electron acceptor region. Optionally, an intrinsic layer is disposed between the electron donor region and the electron acceptor region.

In some embodiments each waveguide is optimized to have maximum efficiency at a specific frequency band, which in the context of such embodiments may be referred to as a spectral component. The waveguides are generally flat, i.e. have a length and width that is significantly larger than their thickness, and are superposed with respect to each other. Radiant energy enters or exits (depending on whether the mode of operation is for splitting into or mixing of spectral components) the waveguide from apertures located on the waveguides thickness side, which is to say from a direction that does not cross or penetrate the thickness direction of the cladding. Stated differently, the incoming radiant energy is incident on at least two layers of the waveguide. One option for optimizing the waveguide involves causing a first converter disposed in a first waveguide among the superposed waveguides to have an energy bandgap that is different from that of a second converter disposed in a second waveguide among the superposed waveguides. Another optional optimization technique involves causing a converter disposed within at least one of the plurality of superposed waveguides to have an energy bandgap level that is slightly higher than the photon energy level corresponding to the cutoff frequency of the waveguide. In general, it is desirable to dimension the waveguide thickness just slightly longer than half the longest wave in the spectral range of interest $\lambda wi$. The longest wave in the spectral range of interest for an individual waveguide within the stacked waveguide, is the longest wavelength that the converter disposed therein can convert. In LE converters the energy bandgap of the converter dictates the longest convertible wave, and the minimal frequency of the spectrum of interest $\lambda wi$ for such waveguide relates to that minimal frequency. While thickness of about 1-2% above $\lambda wi/2$ is a desired aperture, it is expensive and often impractical. Aperture ranges such as 10-20% longer than $\lambda wi/2$ are acceptable for many applications. Waveguide thickness longer than $\lambda$ would still provide advantages, would not provide significant extension of the effective length of the photoactive region due to slowing of the energy propagation within the waveguide. Conversely, causing the energy bandgap to be 5% higher than the photon energy level corresponding to the cutoff frequency of the waveguide would in some situations be a good compromise between performance and cost.

In some embodiments, the core of at least one of the plurality of superposed waveguides comprises a region of transparent conductor disposed between the electron donor region and the cladding and a region of transparent conductor disposed between the electron acceptor and the cladding. In some embodiments a reflective layer is provided at the bottom of the stack of superposed waveguides. The reflective layer may comprise the lower cladding layer of the lowest waveguide, or it may be a dedicated layer. The lowest waveguide in the stack is the waveguide having either the lowest thickness of the waveguide in the stack, and/or the waveguide having the highest energy bandgap converter in the stack.

In certain embodiments at least one first converter is an electricity-to-radiant-energy converter, and at least one second converter is a radiant-energy-to-electricity converter.

In certain embodiments an insulating layer may be disposed between at least two of the plurality of superposed waveguides, while in others the conductive layers of one waveguide may be electrically coupled to the conductive layer, and in some embodiments a single conductive layer may be shared between waveguides of the stack.

In some embodiments a plurality of dispersers embedded within the stack receive radiant energy substantially perpendicular to the surface of the stack, refract the incoming energy to an angle relative to the normal of the stack surface, and emit the energy in such fashion that it is spatially separated into a plurality of spectral components.

In certain embodiments involving energy harvesting or detection, the dispersers may be arranged within or about the waveguides, the dispersers acting to receive incident radiant energy, to bend and spectrally separate it, and to direct spectral components of the incident energy to at least two of respective waveguides, such that each converter receives energy at or near its frequency of optimum efficiency. The energy enters the waveguides of the stack via inlets, the inlets being at the interface where each disperser interfaces with the respective waveguide. This way each waveguide has many inlets, one or more of which are associated with a disperser. CRTRs may be used as dispersers, but other dispersers are also considered, such as prisms, mirrors, diffraction gratings, and the like.

Note that in such embodiments the energy is inserted into the waveguides primarily along the interface between two layers. Such propagation path allows the energy to propagate in such fashion that is perpendicular with respect to the generated electric current within a layered converter disposed within the waveguide.

In an optional embodiment, the photoactive zone comprises a plurality of antennas and the electron donor and acceptor layers are not required. At least two collectors, a positive and a negative, are provided as terminals for collecting electrical energy from the conversion zone. A cladding is disposed about the optical core, which may extend all the way to the waveguide inlet.

In some embodiments, detection and/or measurement of various spectral components may be desired about each disperser. To that end there is provided a layered waveguide stack radiant energy converter array comprising a plurality of superposed waveguides, each waveguide comprising a core layer having a plurality of individual radiant energy converters disposed therein, and two cladding layers disposed on opposing sides of the core; each waveguide having an inlet for passage of radiant energy therethrough, the inlet extending between the cladding layers, such that radiant energy entering the waveguide impinges on at least two layers of the waveguide. The layered stack also contains wiring to provide electrical communication with the plurality of converters disposed in the core. A plurality of dispersers are embedded within the stack for receiving radiant energy substantially parallel to the surface of the stack, refracting the incoming energy to an angle relative to the normal of the stack surface, and emitting the energy in such fashion that it is spatially separated into a plurality of spectral components, wherein each of the plurality of dispersers has at least one converter associated therewith, and receiving a spectral component of the energy impinging thereupon. In certain embodiments, at least two converters are associated with a single disperser, the converters being disposed at a an angle to each other. The optional converter may be directed at sensing another frequency and/or a different polarization than the first converter.

Another aspect of the invention is directed to converting electrical energy to radiant energy. To that end there is provided a layered waveguide stack radiant energy converter array comprising a plurality of superposed waveguides forming a stack, each waveguide comprising a core layer having a plurality of radiant energy converters disposed therein, and two cladding layers disposed on opposing sides of the core, at least one of the plurality of converters being an electricity-to-radiant-energy converter, each waveguide having an outlet for passage of radiant energy therethrough, the outlet extending between the cladding layers, this outlet actually by the principle of reversibility being essentially the same as the inlet which is employed in energy detection/harvesting embodiments. A plurality of radiant energy combiners are embedded within the stack for receiving radiant energy from at least one of the converters and for refracting the incoming energy toward a substantially normal angle to the stack surface; wherein each of the plurality of the combiners has at least one converter associated therewith. Wiring is provided for allowing electrical communication with the plurality of converters disposed in the core.

In some embodiments at least one of the plurality of combiners has at least two converters associated therewith, the converters being disposed at an angle to each other. This makes it possible to emit light of differing polarizations from the combiner. In some embodiments, each of the two converters associated with the refracting structures is fed a different signal.

SHORT DESCRIPTION OF DRAWINGS

The summary, above, and the following detailed description will be better understood in view of the enclosed drawings which depict details of preferred embodiments. It should, however, be noted that the invention is not limited to the precise arrangement shown in the drawings and that the drawings are provided merely as examples.

DETAILED DESCRIPTION

Certain embodiments of the invention will be described herein by way of example to increase the understanding of different aspects of the invention.

The term "stacked" as used herein, except where otherwise clear from context, refers to arrangement of linear or planar elements in substantially parallel fashion such that those elements occupy different locations in a direction perpendicular to, or having a component perpendicular to, the linear or planar direction. For example, waveguide-based converters comprising planar layers may be said to be stacked when they are placed one atop the other such that the planes of their layers are substantially mutually parallel. Note, moreover, that elements may be stacked without necessarily being mutually superposed. Elements are considered superposed when the of one element at least partially overlapse with the perimeter of an adjacent element stacked thereabove or therebelow. However intervening elements and/or spaces may exist between one element and the adjacent element.

Figure 1:
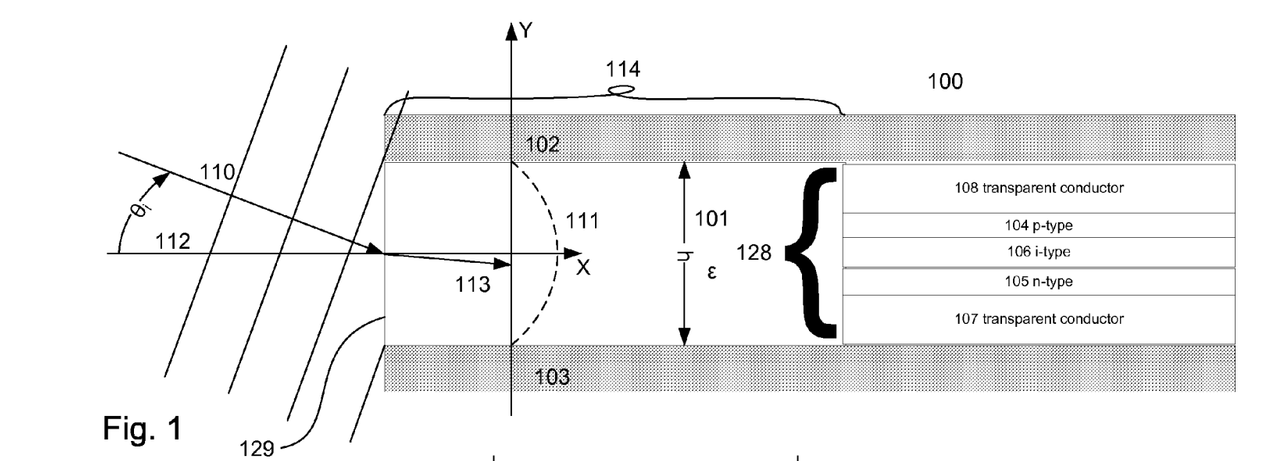
FIG. 1 depicts two-dimensional waveguide—having a converter formed between two bounding layers.

FIG. 1 depicts a short region of a waveguide containing a converter, and is provided for simple explanation of the propagation characteristics of radiant energy within such waveguides, as well as for showing an optional variation on converter construction.

FIG. 1 shows a waveguide 100 comprising a waveguide core material 101 of thickness h formed between conductors 102 and 103. Alternately the waveguide core material 101 could be replaced by a plurality of layers forming an aggregate optically equivalent to a uniform material having dielectric constant $\in$ and the same overall thickness. In certain embodiments, what is labeled as section 114 in the drawing may be eliminated, a waveguide-based converter being formed in that case by the various layers shown. This is the construction suggested for many embodiments of the cell aspect of the invention.

In stacked waveguides as described herein, a portion of such an aggregate waveguide core region may form a photovoltaic converter comprising an electron acceptor region 104 and an electron donor region 105. By way of example, the electron acceptor region may be a p-type semiconducting region 104, and an n-type semiconducting region may form the electron donor region 105. Optional intrinsic region 106 therebetween may exist in some embodiments. Optional transparent conductor regions 107, 108 may also exist in some embodiments. The purpose of optional transparent conductors 107, 108 is to provide a vertical electrical contact to overlying and underlying conductors while allowing the waveguide height to be optimized for frequency while the semiconductor thickness is optimized for carrier collection efficiency. In most embodiments the cladding form the conductors and serve to communicate charge carriers in and out of the stacked waveguides structure, or to an inverter disposed therein. Similarly the plurality of layers may comprise various polymeric materials including dye-sensitized semiconductor, photoabsorptive electron donor, electron acceptor, and transparent conductor regions as are known in the art.

Insertion of radiant energy perpendicularly with respect to the direction of photovoltaic current makes it possible to have short diffusion lengths from the photoabsorptive material to the junction, allowing efficient collection of charge carriers and minimizing recombinant losses. It also provides long optical paths for efficient photoabsorption and concentrates the photon flux close to the photoabsorptive region. In a p-n junction construction, the perpendicular insertion direction increases efficiency by concentrating energy close the junction. Other efficiency benefits are explained below.

Regions 104-108 collectively comprise an aggregate waveguiding region. Aggregate waveguiding regions may be considered to have an average relative dielectric constant $\in$ determined using formulas well known in the art and resulting in a speed of electromagnetic plane wave propagation in the bulk of the material of $V_b = 300 \times 10^6 / \sqrt{\in}$ meters per second. It is noted that $\sqrt{\in}$ is the refractive index (commonly denoted as "k" in semiconductor manufacture field, and as "n" in the field of optics). In most cases, bounding layers 102, 103 are conductors and/or provide mirror-like reflection. This is especially desirable to maximize fill factor in the semiconductor converters by reducing the series resistance of the converter.

The cutoff frequency, $F_{CN}$, of the $N^{th}$ order mode is obtained as $$F_{CN} = N V_B / 2h \text{ wherein } N \text{ is the mode order}$$

Below this cutoff frequency an electromagnetic wave cannot travel laterally along the waveguide X axis. At the critical frequency, a guided plane wave reflects repeatedly between the upper and lower conductors but makes no lateral progress along the waveguide. Above the cutoff frequency a wave travels with a dispersion equation)

$$\beta_N = 2\pi \sqrt{(F^2 - F_{CN}^2)}$$

Wherein $\beta_N$ is wavenumber of the $N^{th}$ order mode, F being the wave frequency, and $F_{CN}$ is the cutoff frequency as described above.

The wave has N half-wavelengths of variation across the thickness, h, and propagates with a wavelength along the guide $$\lambda_{GN} = 2\pi / \beta_N$$

Higher order modes have larger values of N and have higher cutoff frequencies for the same thickness waveguide. An incident plane wave 110 at a low angle of incidence will couple best to the most uniform waveguide mode 111, so the fundamental mode is most readily coupled for incidence parallel to the waveguide.

Light incident at an angle $\theta_i$ 112 with respect to the waveguide axis 112 will be partially refracted into the guide 113 and partially reflected. The fraction of an incident wave admitted into the guide is determined by the integral of the incident wave front 110 with the mode shape 111. Narrow guides compared to the wavelength have a broader angular acceptance range, operate closer to their resonant condition, and have slower energy velocities.

Figure 2:
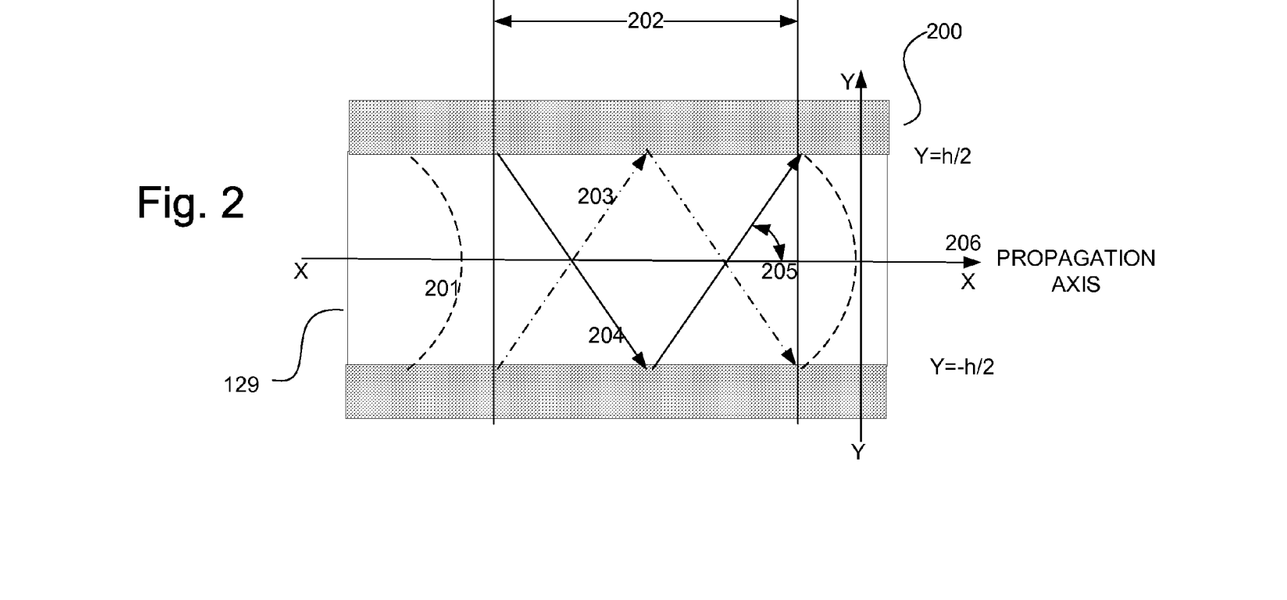
FIG. 2 depicts a simplified diagram of equivalent plane waves propagating within a waveguide being identical to a waveguide mode.

FIG. 2 depicts a waveguide 200 having a width in the y direction of $\pm h/2$ and supporting propagation along the x direction. The waveguide supports a fundamental mode with cross-section amplitude distribution 201 and propagation wave along the waveguide with a frequency-dependent period 202. The wave may be written as $$A_{(X,Y)} = \cos\left(\pi \frac{y}{h}\right) * \exp(j\beta_N X - j 2\pi F t)$$

The cosine is ½ the sum of two exponentials, representing upward 203 and downward 204 plane waves. The waves make an angle 205 with respect to the propagation direction 206, given as $$\theta = \cot^{-1} \sqrt{\left(\frac{F^2}{F_C^2} - 1\right)}$$

such that as frequency, F, approaches the cutoff frequency, $F_C$, the angle approaches 90°.

Figure 3:
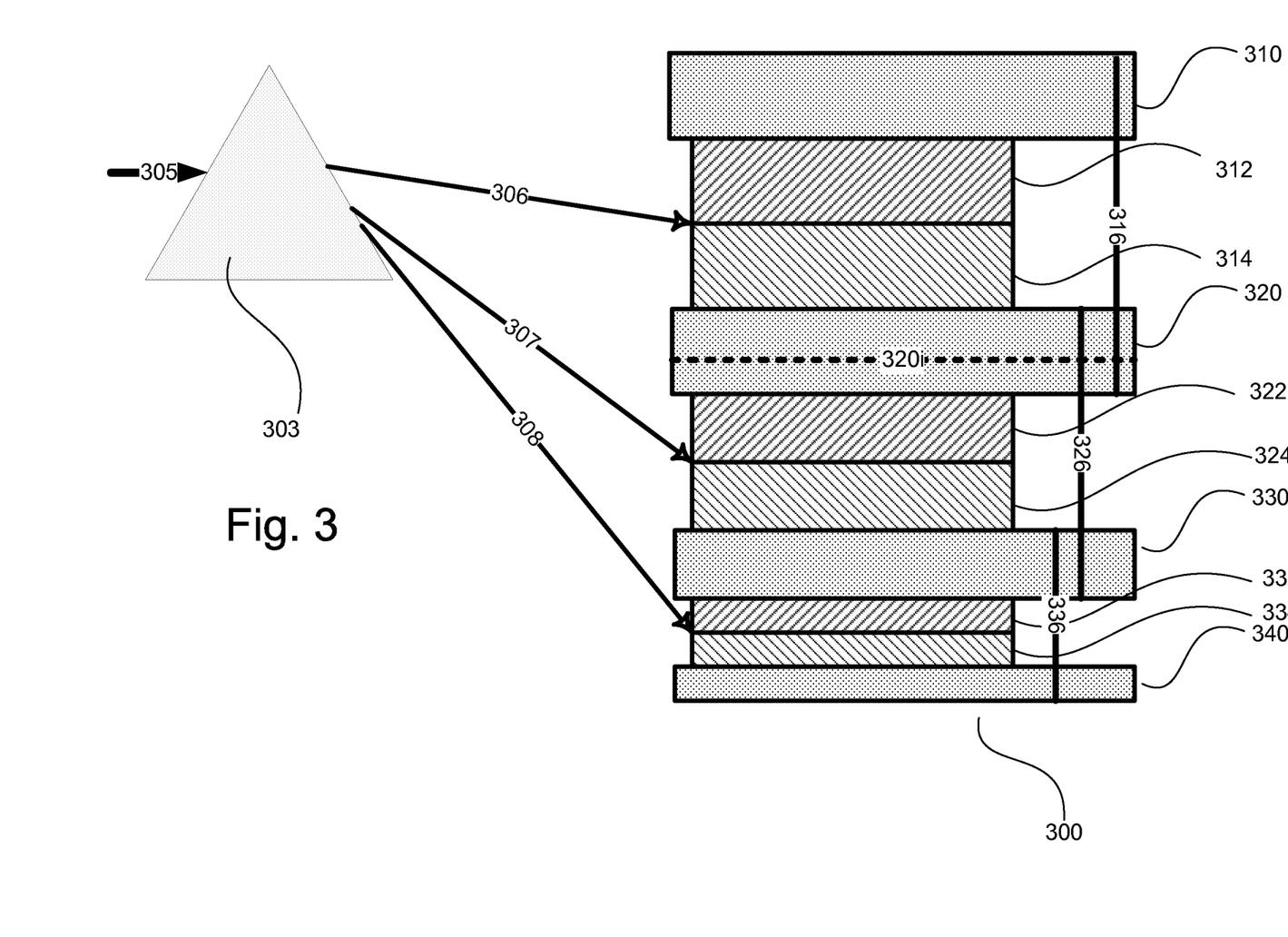
FIG. 3 depicts a simplified schematic diagram of stacked waveguides utilizing a prism as a simple example of a refractor acting as a disperser.

A simplified diagram of a three-layer waveguide stack is depicted in FIG. 3. The conductors 310, 320, 330, and 340 define the waveguides, act as cladding and as charge conductors, and are commonly made of metal, even if other conductors may be used. Waveguide 316 is formed of metal layer 310, converter layers 312 and 314 which act as a core, and metal layer 320. Similarly, waveguide 326 is formed by metal layer 320, converter layers core 322, 324 and metal layer 330. Waveguide 336 is formed by metal layer 330, converter layers 332 and 334, and metal layer 340. Dashed line 320i signifies an optional construction in which an insulating layer may be laid between successive conductive layers.

Prism 303 is provided for illustration purposes and represents any spectral disperser/refractor. Multispectral radiant energy 305 enters the prism and departs as refracted and spatially separated spectral bands, which are in turn directed at the respective waveguide-based converters.

Converter layers are depicted as comprising layers 312, 322, and 332, which may be considered as electron donors; and layers 314, 324, and 334, which may be considered as electron acceptors. It is noted that in this embodiment spectral band 306 has longer wavelength than spectral band 307, which in turn has longer wavelength than spectral band 308. It is further noted that each of the corresponding waveguides 316, 326, and 336 are likewise dimensioned differently, such that the cutoff frequency Fc of each waveguide is slightly lower than the lowest frequency of the spectral band which impinges thereupon.

With reference again to FIG. 1, a waveguide 100 has at least one aperture 129 through which energy is admitted. The aperture 129 admits energy along the axis defined by the local plane of the core and the cladding, or stated differently, in edge-on fashion rather than by penetration through or across the thickness direction of the cladding. The edge referred to in the context of this edge-on admission of energy may be an actual edge of the stacked waveguides sheet or it may be at the interface between the waveguide and structure embedded in the waveguide stack, such as a refractor operated as disperser or a combiner, or connecting materials and structures. In some embodiments the edgewise opening and waveguide material may be inclined to the waveguide plane, but as the energy would enter or depart the stacked waveguide through its edge, the stacked waveguide aperture size $\psi_L$ should be construed to be the waveguide thickness at the first instance where a wave entering the guide would propagate between the two cladding layers. It is important to recognize the significance of the fact that in the stacked waveguide energy enters the waveguide in edge-on manner rather than by penetration through or across the thickness of the cladding. Causing energy to enter from the side, or edge, of the waveguide, reduces losses and allows efficient, low-loss conversion of the incoming energy, as well as efficient, low-resistance, and inexpensive removal of charge carriers from the stack, for utilization of the harvested energy, for detection of the different spectral components of incoming energy, for light mixing when the waveguides operate as light sources for mixing mode operation such as certain types of displays, or for controlled reflection of incoming energy.

In stacked waveguides having EL type converters, it is often desirable to slow down the energy propagation in order to achieve longer effective length along the converter. As the energy velocity slows, the effective length of the converters disposed within the waveguide increases, as does the efficiency of the converter, due to a combination of higher electron/hole pair or exciton creation, reduced recombination losses, and the statistical concentration of energy at the center of the waveguide, at which the donor/acceptor junction is preferably disposed. In such waveguides, $F_{Lmin}$ is the lowest frequency wave having sufficient energy level for causing an electron in the converter to undergo transition from a valence band to the conduction band. The stacked waveguide aperture size $\psi_L$ in some embodiments is slightly higher than half the wavelength $\lambda_{Lmax}$ of $F_{Lmin}$ so as to admit such wave. It is desirable to follow closely the guidance of slightly larger $\lambda_{Lmax}/2$ guideline for the aperture size in order to maximize the waveguide effective length; however, tight tolerances are often impractical due to manufacturing tolerances, cost consideration, and the like. Thus a very wide range of aperture size is acceptable, and the waveguide should be considered to slow the propagation speed significantly if it provides propagation speed ranging from 90% or slower of the energy propagation speed in the unrestricted waveguide material. 50% is desired, and slower ranges such as 25%, 10%, and the like are also beneficial. To obtain an energy velocity which is 50% of the unguided wave speed requires the cutoff frequency to be at least 86.6% of the frequency of the wave to be so slowed. This is a reasonable design goal with ±10% dimensional tolerance since the wave would still be admitted into the waveguide at the process limits. Obtaining an energy velocity which is 20% of the unguided wave speed would require the cutoff frequency to be 98.7% of the target frequency and would require ±1% process tolerances, which are possible but typically imparts additional cost.

The slowing factor is also the factor applied to the length required to absorb the guided wave in a harvesting converter disposed within the waveguide. Therefore if 100μ is required to absorb a given fraction of energy in bulk material, a 50% slowing factor allows the same collection efficiency in 50μ, and a 20% slowing factor allows collection of the same fraction of energy in only 20μ when measured parallel to the converter plane.

Preferably, the electron donor layer of one of the stacked waveguides has an energy bandgap that is different from the energy bandgap of the electron donor layer of another one of the stacked waveguides.

The superposed construction of the stacked waveguide provides additional advantages. The metal layers 310, 320, and 330 provide charge removal at relatively small distances from the junction, reducing resistive losses; however, they also simplify the layer deposition process as it allows better flexibility in material selection. The superposed construction allows for optional optimization of the converter to the energy level it receives, which protects the converter material from radiation damage as each waveguide receives only a portion of the total converted spectrum. Radiation enters necessarily into the waveguide; however, as the converter in each waveguide is optimized for a specific energy level, and receives only radiation which is closely matched to its energy bandgap, thus increasing the longevity of the structure as well as conversion efficiency. Furthermore, in the superposed structure, the top metal layer 310 provides protection from radiation and/or the elements.

Optionally an insulator 320i is disposed between the metal layer of one waveguide and the waveguide disposed thereabove. In other embodiments the metal layers of two adjacent waveguides among the plurality of the stacked waveguides may be formed by a single metal layer. In some embodiments the converters within the waveguides are arranged to have the same polarity, and in some they are arranged to have opposite polarity. The term polarity refers to the fact that the metal layer closer to the electron donor region of a waveguide is considered an anodic layer and the metal layer closer to the electron acceptor region of the waveguide is consider a cathodic layer. Stated differently, in the same-polarity arrangement the electron acceptor region of the first waveguide would be closer to the electron donor region of the adjacent waveguide than to the electron acceptor region thereof; while in the opposite-polarity arrangement, the electron acceptor region of one waveguide would be closer to the electron acceptor region of the adjacent waveguide, than to the electron donor region thereof.

A prism as depicted in FIG. 3 may be utilized to separate incoming energy into components. Note that a prism is shown merely as one example, it being possible to employ any of a variety of devices to split, disperse, refract, or otherwise separate the incoming energy so as to obtain at least one component, e.g., spectral or polarization component, therefrom. Note that such separation may be spatial, in which components are made to occupy different locations or angles in space, and/or may be temporal, in which such components are made to be in different phase or other such temporal relationship with each other. Note, moreover, that by the principle of reversibility where splitting into component(s) is shown or described, the reverse process, i.e., mixing of components to obtain multispectral radiation, is also implied thereby and is in general also included within the scope of the invention except where otherwise clear from context.

Figure 4:
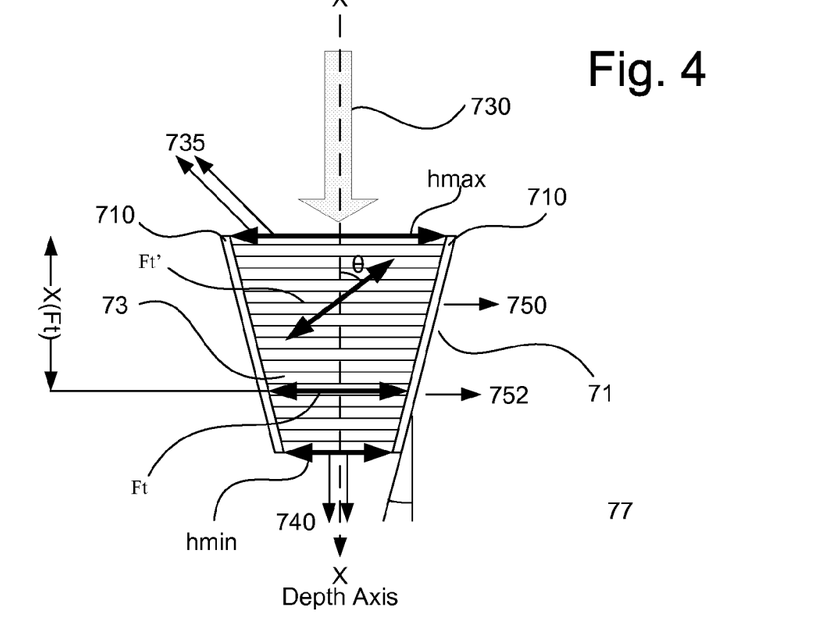
FIG. 4 depicts a cutout of a simplified CRTR.

One such device is known as a CRTR, a simplified diagram thereof appearing in FIG. 4. The term Continuous Resonant Trap Refractor (CRTR) should be construed as relating to the device described herein, which may be operated as radiant energy disperser and as radiant energy combiner, or in combinations thereof, and the terms of the CRTR name should not be individually construed. A CRTR is a device which allows passage of radiant energy therethrough, while a. imparting a change in the direction of propagation of incoming energy;
b. in one mode is operational to spatially disperses incoming energy into spatially separated components thereof, the mode referred to as disperser, splitter, or dispersion mode; and,
c. in another mode is operational to combine a plurality of incoming energy components into emitted energy comprising the components, the mode referred to as combiner, mixer, or mixing mode.

notably a CRTR may be operated in a combination of these modes.

A CRTR comprises a waveguide having a tapered core 73 and a cladding 710; the core having an aperture and a tip. The larger face (denoted hmax) of the tapered waveguide core will be generally referred to as the CRTR aperture, and the smaller face, or point, will generally be referred to as the tip, and the axis X-X extending between the aperture and the tip would be referred to as the CRTR depth axis. Radiant energy 730 admitted via the aperture travels along the depth axis; however, the energy may travel towards the aperture, or away therefrom. In disperser mode" a CRTR admits energy within a spectral range of interest via the aperture and emits it in a frequency sorted fashion via the cladding. A CRTR operating in mixer mode admits radiant energy via the cladding and mixes and emits the energy via the aperture. Notably, a certain angle shift occurs in the process, and thus, energy entering the CRTR from its aperture will be angled away, i.e. refracted, and emitted at an angle to the depth dimension in a splitter mode. In mixer mode energy entering the CRTR via the cladding will couple to the core and would be angled away from the direction in which it was injected, to be generally aligned with the depth axis and emitted via the aperture. The CRTR has a width dimension in at least one direction substantially perpendicular to the depth axis. The core width varies in magnitude so as to be greater at the first end than at the second end. The core width is also dimensioned such that when multi-frequency energy is admitted through the core and propagates along the core depth, it will cause a lower frequency spectral component to reach a cladding penetration state at a first depth, and the core will further taper to a width that will cause energy of a higher frequency spectral component reach a cladding penetration state at a second depth, which is larger than the first depth.

At its wider base known as the aperture, the CRTR has a width hmax, which limits the lowest cutoff frequency Fmin. At the tip the tapered core width hmin dictate a higher cutoff frequency Fmax. Between the aperture wide inlet and the narrower tip, the cutoff frequency is continually increased due to the reduced width. Energy, such as polychromatic light 730 is incident the aperture at an angle which permits energy admission. Waves having a lower frequency than the cutoff frequency Fmin are reflected 735. Waves 740 having frequency higher than Fmax exit through the CRTR core, if an exit exists. Waves having frequencies between Fmin and Fmax will reach their emission width, and thus their cladding penetration state, at some distance from the inlet of the waveguide depending on their frequency. The distance between the inlet and the emission width of a given frequency is the emission depth.

Thus, examining the behavior of a wave of arbitrary frequency Ft, where Fmin<Ft<Fmax, which enters into the CRTR core at its aperture at an incidence angle within an acceptance cone centered about the propagation axis X-X, the angle θ between the wave and X-X will vary as the wave propagates along the X-X axis due to the narrowing of the CRTR waveguide and increase of the cutoff frequency, as depicted schematically by Ft'. As the wave approaches depth X(Ft) where either the tapered waveguide cutoff frequency equals or nearly equals Ft, or the angle θ approaches the critical angle θC, at which the wave can not propagate any further within the CRTR core. The wave Ft is thus either radiated through the dielectric cladding of the CRTR as shown symbolically by 750 and 752, or is trapped in resonance at depth X(Ft) in a metal clad CRTR. At that point the wave of frequency Ft reached its cladding penetration state at the emission depth dictated by the emission width of the tapered CRTR core. For a continuum of entering waves of different frequencies Fmin<F1, F2, . . . Fx<Fmax, entering the base of the tapered waveguide 71, it becomes a Continuous Resonant Trap Refractor (CRTR) in which the different frequency waves become standing waves, trapped at resonance in accordance to their frequency along the X-X axis. Such trapped waves are either leaked through the cladding by the finite probability of tunneling though the cladding or are lost to absorption in the waveguide. Note that since a CRTR will in general also cause admitted rays (speaking from the perspective of a CRTR operating in splitter mode) to be refracted or otherwise redirected so that the component(s) produced by splitting exit the CRTR at an angle to the CRTR depth axis, this will make it possible to employ a CRTR that has been embedded within stacked waveguides in such a manner that the CRTR directs specific components, e.g., spectral components, of the incoming multispectral radiation to predetermined waveguides.

CRTRs are often disposed within the stacked waveguides such that the CRTR depth direction is substantially perpendicular to the local plane of layering of the stack. Each of the superposed waveguides in the stack is preferably disposed to receive a spectral component of the multispectral radiation admitted by the CRTR aperture. The respective spectral components impinge on the respective stacked waveguides, each of which preferably contains converter(s) closely optimized to the frequency of that particular spectral component for efficiency, longevity, and the like.

CRTR's may also operate to combine radiation from the waveguides, and may then be considered as radiant energy combiners.

In most embodiments, stacked waveguides are of flat construction, such that the waveguide layers extend both longitudinally and laterally such that the thickness of the waveguide stack is substantially smaller compared to its other two dimensions. While stacked waveguides may be produced in a variety of ways, a common method of manufacture is by depositing layers of materials having desired properties one above the other. Depositing layered materials to form layered substrate is well known in the art, and techniques used in the semiconductor and other industries for such deposition will be clear to the skilled in the art. By way of non-limiting examples, such deposition methods may include evaporation, sputtering, sublimation, and the like. Roll-to-roll manufacturing technology utilizing deposition is also well known in the art. In their article in the EE Times© dated Jul. 10, 2012 and titled "Roll-to-roll manufacturing for small molecule flexible OLED devices", S. Mogck, C. Lehmann, T. Wanski, C. Rahnfeld and C. May describe several web deposition method and the skilled in the art would recognize additional applicable technologies. The above identified article is incorporated herein by reference in its entirety. Combinations of material families to be deposited are dictated by the device to be manufactured, and are generally a matter of technical choice. Generally, layers being deposited at sub-micron to micron-scale thicknesses with good uniformity, precise thickness control, and low stress are highly desired, as are good adhesion to the substrate and compatible thermal properties.

The cladding of the CRTRs and/or the stacked waveguides may comprise a plurality of materials and may be deposited in several stages. Aluminum, silver, copper, and gold are among the many candidate metals that are highly reflective, electrically efficient and chemically stable, although numerous other examples are readily considered. Employment of dielectric cladding is of course possible; however, if dielectric cladding is used, separate charge collectors should be provided to lead charge carriers outside the waveguides stack.

Layers and portions of the stratum may be formed as a single undivided layer, or may be divided into sections. Sections may be separated electrically and/or optically, and the barriers between the different sections will generally be referred to hereinunder as "baffles". A common division is to provide baffles to separate the region around a single CRTR and thus create a single CRTR pixel; however, divisions containing more than one CRTR may be formed if desired. A pixel may be a light emitting pixel, a detecting/harvesting pixel, or a combination thereof. The stratum may also comprise circuitry such as conductors, vias, and the like as required for connecting individual pixels. The stratum may also contain active and passive electronic components, such as amplifiers, controllers, switches, and the like. In certain embodiments the stratum may comprise inactive layers.

Figure 5:
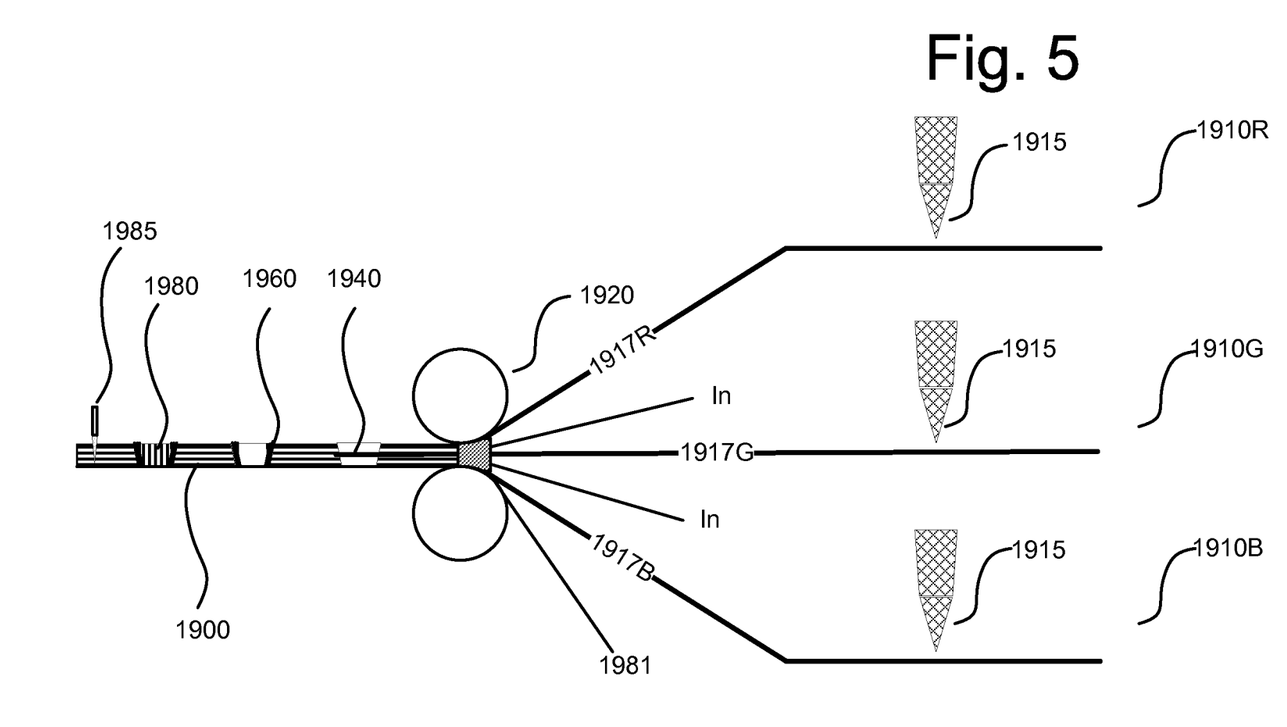
FIG. 5 illustrates a simplified schematic manufacturing method utilizing individual, pre-prepared waveguides being laminated together to form a waveguides stack.

A simplified example of an optional method of manufacturing layered waveguides stack which incorporate CRTRs is depicted in FIG. 5. This structure is especially suitable for sub-millimeter waves in which layer thicknesses and CRTR dimensions more easily allow laser drilling, flexographic printing, and laminated sheet stack-up methods, but may be utilized for higher frequencies as well.

An initial step of laminating a stratum 1900 containing three stacked waveguides is shown and is readily extended to more or fewer waveguides and their respective spectral component bands. Firstly individual waveguides 1910R, 1910G, and 1910B are formed, each containing at least one converter. The converters may be LE or EL type, and may comprise continuous layers, or may be formed of individual 'pixel' converters. Preferably, the individual waveguides are optimized by dimension and/or converter design, for their intended spectral component. If required for the application to which the stratum is directed, conductors 1915 are then added to the individual stacked waveguides 1917R, 1917G, and 1917B, to allow electrical coupling to individual converters of individual regions or pixels. Adding conductors only to one side is shown, but adding to both sides will be clear to the skilled person.

The individual waveguides 1910R, 1910G, and 1910B are then laminated together 1920, optionally with electrically insulating material Ln therebetween, and the laminated individual waveguides then form a stack of "stacked waveguides". An optional substrate layer may also be added. Pits for CRTRs are etched, laser drilled, ion milled, or otherwise formed 1940, and the edges of the pits are coated with cladding material 1960. Core material is added 1980 into the pits, creating the functional CRTR. In optional step 1985, baffles are introduced into the converter sheet to separate the stacked waveguides into individual pixels. By way of example, baffles may be created by etching, milling, or otherwise cutting into the sheet to a desired depth, and depositing metal or other light-blocking material, forcing a material grid through the waveguide stack, and the like. Baffles may also be introduced during other stages of the manufacturing process.

The ability of laminating or deposition processes to control the thickness of each layer allows precise creation of stacked waveguides. Therefore by way of example, if a waveguide is designed to receive radiation in the 450-500 nm range, the desired waveguide aperture size would be slightly above 250 nm, compensated for propagation delay within the waveguide materials. Such dimensioning would slow the energy propagation speed of the light energy within the stacked waveguide, and increase its effective length for conversion. However, any desired thickness above the 250 nm may be utilized.

Figure 6:
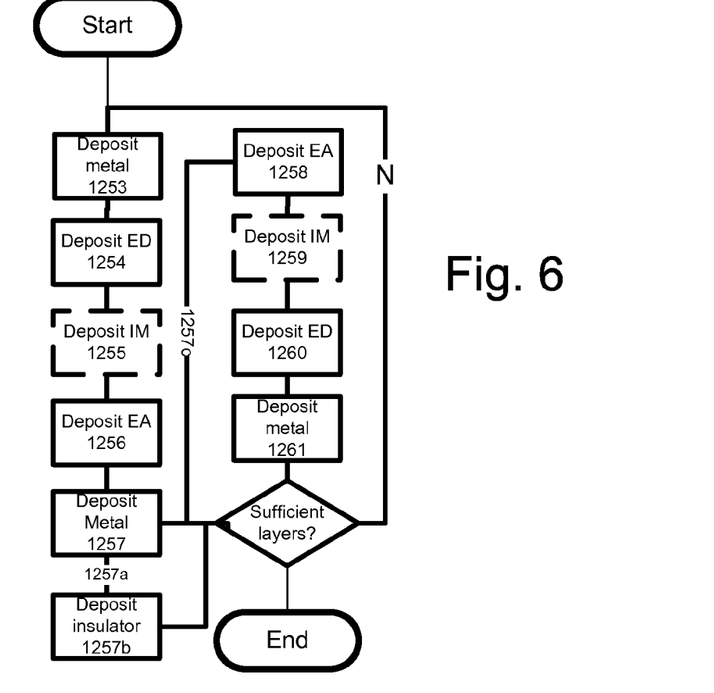
FIG. 6 depicts a flow diagram of a method of manufacturing waveguides stack.

A simplified flow diagram of a second process of creating a layered stratum of stacked waveguides is depicted in FIG. 6. The stacked waveguide may have EL and/or LE structures comprising donor and acceptor layers. First, metal is deposited 1253 on a suitable substrate, then an electron donor material is deposited 1254. Optionally a layer of intrinsic material is also deposited 1255. An electron acceptor region and a second metal layer (which may optionally be of different metal type from the metal of step 1253) are further deposited in steps 1256, 1257 respectively. The process may then be repeated until sufficient number of layers are deposited.

Optionally path 1257a is followed to deposit insulator layer 1257b. In another embodiment, the layered stratum is constructed such that electron donor layers are deposited in back-to-back relationship to each other, separated by at least a metal layer. In such cases, path 1257c is followed, and another electron acceptor layer is deposited 1258 on the metal layer of step 1257, followed optionally by intrinsic material 1259, by electron donor layer 1260, and by another metal layer 1261. It is noted that in such method the two adjacent converters have mutually opposite polarity. As before, if the desired number of layers have been reached, the creation of the stratum is then complete, and if more layers are desired, the process is repeated. With each layer baffles 1225 or portions thereof may be deposited between individual sections of the stratum. Commonly, the baffles will form a light barrier either by being reflective or absorptive. In certain embodiments the baffles will be electrically conductive and optionally form electrical interconnect vias.

Figure 7:
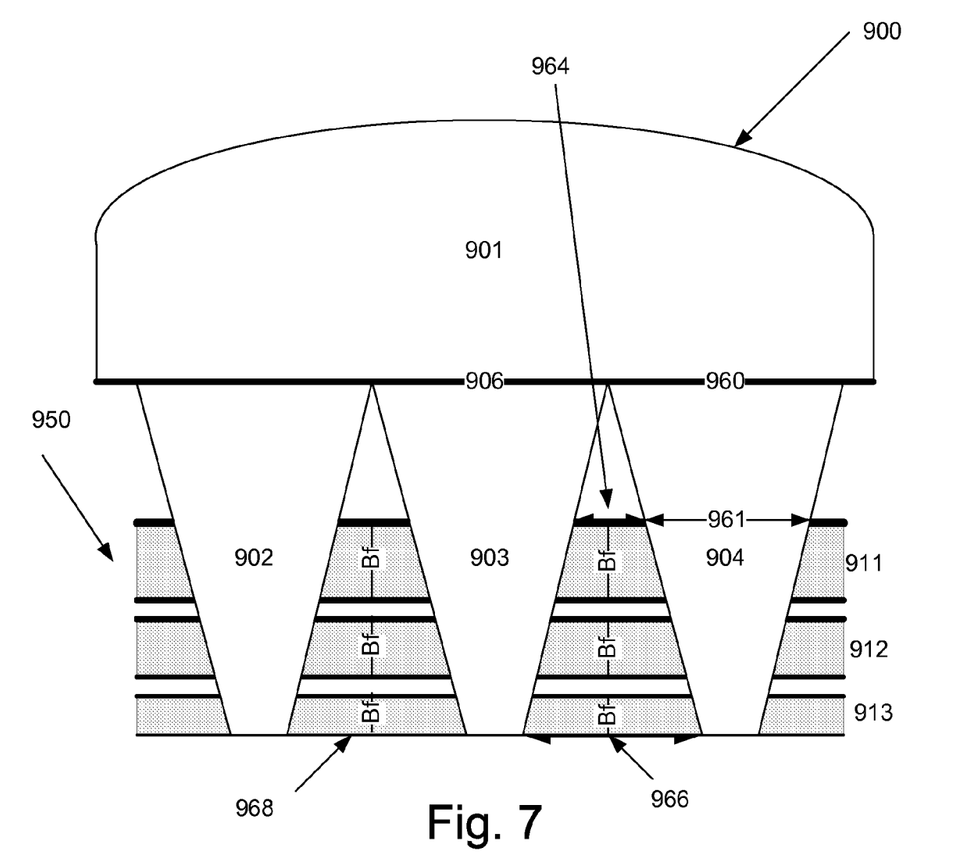
FIG. 7 depicts a schematic cross-section of a section of a focal plane sensor having a lens integrated therewith, and utilizing stacked waveguides.

FIG. 7 depicts a schematic cross-section of a section of a focal plane sensor 900 having a lens which acts to project an image onto a focal plane 906. In certain embodiments, a high pass filter is incorporated into the lens. A multiplicity of CRTRs, three of which 902, 903, and 904 are shown in the drawing, are arranged with their apertures (wide ends) in the focal plane of focal plane sensor 900, providing effectively complete collection of radiant energy captured by the lens of focal plane sensor 900. By making the apertures 960 of the CRTRs wider than the critical width 961 at the lowest frequency of interest $F_{MIN}$ all desired frequencies are accepted into the waveguides. Where the CRTRs taper, there exists space therebetween for converters 911, 912, 913, which are disposed within the stacked waveguides 950. Baffles Bf isolate each pixel from its neighboring pixels.

Examining FIG. 7, one notices that because of the growing inter-CRTR distances with increasing depth from the CRTR apertures, the top conductor layer 964 will have narrower distance between individual CRTRs than successively lower conductor layers, with bottom layer 966 being the least disrupted by the CRTRs. It is seen therefore that if kept at the same thickness, conductor layers closer to the aperture would present increasing resistance to current passage than lower layers. Therefore, in energy collection applications such as solar cells, it is often desirable to make the conductive layers successively thicker from the bottom conductor 966 to the top conductor 964. While a single thickness may be selected to alleviate this problem to the point of non-importance, such approach is wasteful both in material and in reducing the effective energy collection area, as it increases the total thickness of the conductor layers, and decreases the exposure area available for the waveguide apertures to interfaces the CRTR.

Figure 8A:
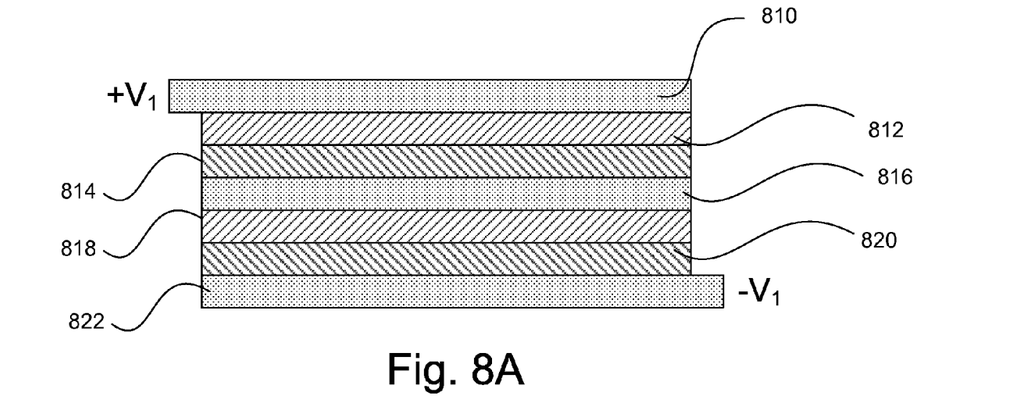
FIG. 8A depicts an example of series connected waveguide-based converters.

The converters disposed within the waveguides may be of varying compositions and arrangements. In some arrangements, such as for solar cells, the converters may by way of example be connected in series as shown in FIG. 8A. Top contact conductor 810 acts as a positive electrode +V1, and is a conductor compatible with P-type layer 812 which is in contact with N-type layer 814, which is in electrical communication with conductor layer 816, which is in turn in electrical communication with P-type layer 818, followed by N-type layer 820. Bottom electrode 833 provides the negative electrode −V1. The skilled in the art would readily recognize that as many layers as desired may be similarly deposited. While series connection may be advantageous for certain embodiments, parallel connection is often more desirable. In contrast to the arrangement of FIG. 8A, the converters of FIG. 3 are preferably connected in parallel, such that the output of every converter is brought out of the stack by metal layers 310, 320, 330, and 340 acting as electrodes to extract electrical energy from the respective converters in parallel.

Figure 8B:
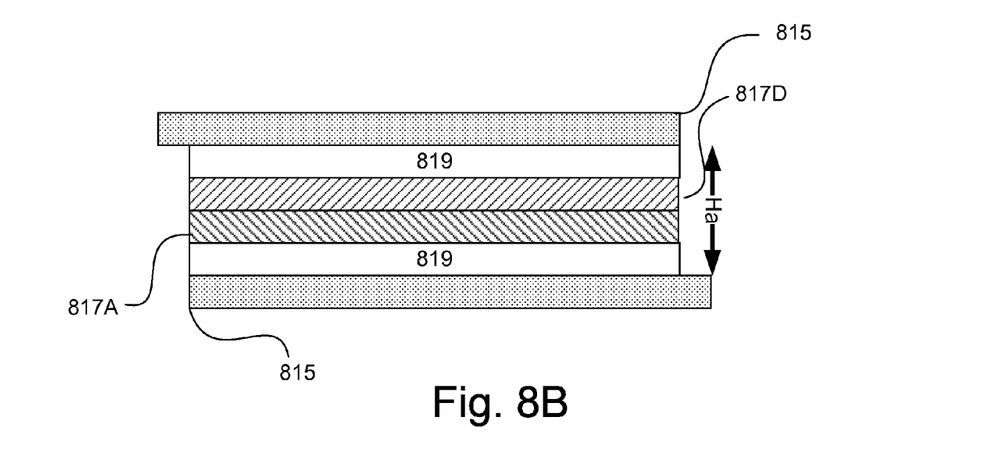
FIG. 8B depicts the cross-section of a single waveguide of a stacked waveguides set, and a converter, utilizing conducting metal regions for obtaining the desired waveguide thickness at the waveguide spectral range of interest.

FIG. 8B depicts an optional arrangement of a stacked waveguide with a converter. Conductive layers 15 form the cladding and act as electrodes. The converter, depicted in this case as donor/acceptor layers 817a and 817D respectively, are disposed within the waveguide core. This optional embodiment utilizes transparent metal layers 819 between the converter and the conductors.

The bandgap of the waveguide-based converters preferably correspond to a wave frequency equal or approximately equal to the cutoff frequency of the stacked waveguide in which they are disposed. In this way, energy that is accepted into the waveguide is able to generate electron-hole pairs in the bulk of the electron donor/acceptor regions. Regions 817A and 817D are on the order of the diffusion length of carriers in the respective regions such that electron-hole pairs have a high probability of experiencing the junction fields and being directed to the respective sides of the junction. In some embodiments, the combined thickness of regions 817A and 817D is comparable to the depletion region of the junction formed therebetween. As this thickness may be far smaller than the stacked waveguide aperture size Ha, the transparent conductor layers 819 allow the waveguide to be tuned for the impinging spectral component.

The waveguide-based converter provides the advantage that the energy impinges laterally, on the side of the junction, by virtue of the junction being parallel to the waveguide, as well as from the top and bottom, by virtue of reflective containment within the waveguide. Most of the photons are concentrated near the junction. The lateral penetration allows long conversion area along the junction and at close proximity thereto.

High efficiency is obtained when (a) all significant frequencies of incident energy are directed to a specific converter in the stack optimized for that frequency, (b) the optimally directed energy travels lengthwise along the waveguide in the stack with a photon energy just slightly in excess of the bandgap, (c) the energy velocity of the optimally directed frequency in the corresponding waveguide is small such that the photons have a high residency time in a comparatively shorter waveguide, (d) the electron-hole pairs that are generated by optical absorption have a high probability of being separated across the junction, and (e) the series resistance through optional transparent conductors is small. Material selection for several waveguide-based converters is provided hereinunder by way of non-limiting example, to assist the practitioner in designing and practicing this aspect of the invention. A layer comprising amorphous silicon offers bandgap energies of about 1.7 eV (0.730 µm) while another layer of poly-silicon or single crystal silicon offers a lower bandgap of 1.1 eV (1.127 µm) and germanium allows 0.67 eV (1.851 µm). Indium gallium arsenide can be selectively varied from 0.36 to 1.43 eV (3.444-0.867 µm), gallium arsenide phosphide can be selectively varied from 1.43 to 2.26 eV (0.549-0.867 µm), aluminum indium arsenide can be varied from 0.36 to 2.16 eV (0.574-3.444 µm), indium gallium nitride can be varied from 2 to 3.4 eV (0.365-0.620 µm), aluminum gallium nitride can be varied from 3.44 to 6.28 eV (0.197-0.360 µm) and silicon-germanium alloys can be varied from 0.67 to 1.1 eV (1.127-1.851 µm). The vast combinations of alloys and junction combinations are a matter of technical choice. Clearly, tailored bandgaps can be selected from 0.36 eV (3.44 µm) or deeper into the infra-red to 6.28 eV (0.197 µm) or higher into the ultraviolet.

Polymer and dye based converters (also commonly known as 'organic' converters) enjoy similar and even enhanced advantages as compared to the advantages the present invention provides to semiconductor photovoltaic process. Excitons produced in organic semiconductors are closely coupled electrons and holes with little natural diffusion before recombination. A serious limitation of organic converters to date is the extremely small diffusion length of these charge carriers. Utilizing the principle of single moded waveguides matched to the bandgap of a polymer based converter allows utilization of very thin photoabsorptive electron donor layers in close proximity to the electron and hole acceptor layers, which increases the efficiency of such cells. The term 'polymer based' relates generally to dye based, direct polymer junctions, and the like.

Organic and inorganic converters utilize different mechanisms. In the case of organic polymer based converters, the converter comprises electron acceptor and photoabsorptive electron donor semiconductor layers. The radiant energy absorption of the donor preferably corresponds to a wave frequency approximately equal to the cutoff frequency of its stacked waveguide. Hetero junctions between acceptor and donor regions produces the photovoltaic output. When relating to polymer-based converters, the interface between the electron donor region and the electron acceptor region may be considered a junction for practical purposes, whether they form a heterojunction or not.

There are several developmental large bandgap organic semiconductors, with one of the most mature being poly(3-hexylthiophene), P3HT, in a heterojunction with [6,6]-phenyl-$C_{61}$-butyric acid methyl ester (PCBM), obtaining a 5% efficiency. The bandgap of P3HT is around 1.9 eV, limiting the absorbance to below a wavelength of 650 nm. At 650 nm only about 20% of the total amount of photons can be harvested, hence decreasing the bandgap increases the total amount of photons that can be harvested from the solar spectrum.

"Small Bandgap Polymers for Organic Solar Cells (Polymer Material Development in the Last 5 Years), by R. Kroon, M. Lenes, J. Hummelen, P. W. M. Blom, and B. de Boer, Polymer Reviews, 48:531-582, 2008 discusses the efficiency factors of organic semiconductor materials and discusses the need for lower bandgap materials. This article is incorporated by reference herein in its entirety.

For the purposes of the waveguide-based converters relating to the present invention, the type and structure differences between different converter types may be ignored, and the invention applies to any LE or EL converter regardless of the mechanism of operation or the specific structure described or claimed.

The preferred waveguide thickness of a stacked waveguide is dependent on the minimum energy and also on the dielectric constant of the semiconductor. Relative dielectric constants of semiconductors range from about 9 for $Al_xGa_{1-x}N$, 12 for silicon to about 18 for InSb. For providing a nonlimiting design example for solar radiant energy, free space wavelength of 300 nm is considered as an upper limit of interest. 300 nm radiation has a wavelength of 100 nm in $Al_xGa_{1-x}N$, yielding 50 nm as the cutoff point for propagation of such radiant energy through the guide. Selecting a waveguide thickness slightly thicker than the cutoff value is appropriate. The wavelength of 3.3 µm is considered a lower limit of interest for the present example. 3.3 µm radiation has a wavelength of slightly less than 1 µm in $In_xAl_{1-x}As$, yielding 500 nm as the cutoff point for propagation of such radiant energy through the guide.

These relatively thin waveguides offer a significant advantage over the present state of the art when used with the other features of the present invention. By confining the wave to distances from the PN junction of a few hundred nm or less, the internal quantum efficiency is dramatically improved. Prior art utilized normal incidence and thus required a larger thickness in order to ensure photon absorption; however, the present invention provides for efficient photon absorption by directing the photons along the junction, and in a direction perpendicular to the electric current. In addition to the increased absorption efficiency, thin waveguides in accordance with aspects of the present invention utilize, lower volumes of expensive semiconductor or other converter material may be utilized.

A. J. Ptak and D. J. Friedman's paper, "Enhanced-Depletion-Width GaInNAs Solar Cells Grown by Molecular-Beam Epitaxy", presented at the 2004 DOE Solar Energy Technologies Program Review Meeting, Oct. 25-28, 2004, which is incorporated by reference herein in its entirety, discloses that the diffusion lengths in this material is insufficient for their structure unless the depletion width is increased to 2.5 μm. Without light trapping, the material cannot be made thinner in normal-incidence stacked layers because of the low probability of capturing a photon in a smaller propagation path. A decided advantage of certain aspects of the present invention is that while carriers may have extremely short (25-250 nm in the above examples) vertical electrical path lengths to the junction, laterally guided photons can simultaneously have an arbitrarily long interaction length with the semiconductor and are moreover guided at an energy velocity which is substantially less than the free space speed of light. Internal quantum efficiencies will almost always approach unity and will be limited by the quality of the semiconductor itself. In many cases the junction depletion will approach the waveguide thickness. Photon capture probability will approach unity as well, provided the design of the CRTR and the layering of the waveguide-based converters are adequately balanced. Such construction offer wider design selection of dimensions and P—N materials to increase the total efficiency of a radiant energy converter utilizing those techniques.

By way of non-limiting example, the stacked waveguide-based converter thicknesses might vary from 70 nm to 700 nm so as to only allow fundamental waveguide modes at the target frequencies while offering some margin for the cutoff frequencies. The amount by which the thickness exceeds the critical thickness determines the propagation constant of the guided wave. Waves closer to the critical frequency propagate more slowly and interact more with the waveguide layer per unit width. However, waves between the critical frequency and the bandgap energy do not contribute to power conversion and waves above the bandgap energy generate waste heat due to the excess energy. Balancing these competing efficiencies is a matter of technical choice. One consideration is to make the waveguide begin to accept frequencies slightly above the bandgap energy's equivalent frequency rather than allowing the waveguide to accept energy below the bandgap energy. Ten percent above the bandgap energy equivalent frequency above may be used by way of example, but the selection is a matter of technical choice. This ensures that photons admitted into a converter waveguide will be able to excite charge carriers. On the other hand, if the refractor efficiently prevents low frequency radiant energy from entering a given waveguide by properly diverting it to a more appropriate waveguide, then it is possible to oversize the waveguides without loss of efficiency due to unconvertible photons.

Figure 9:
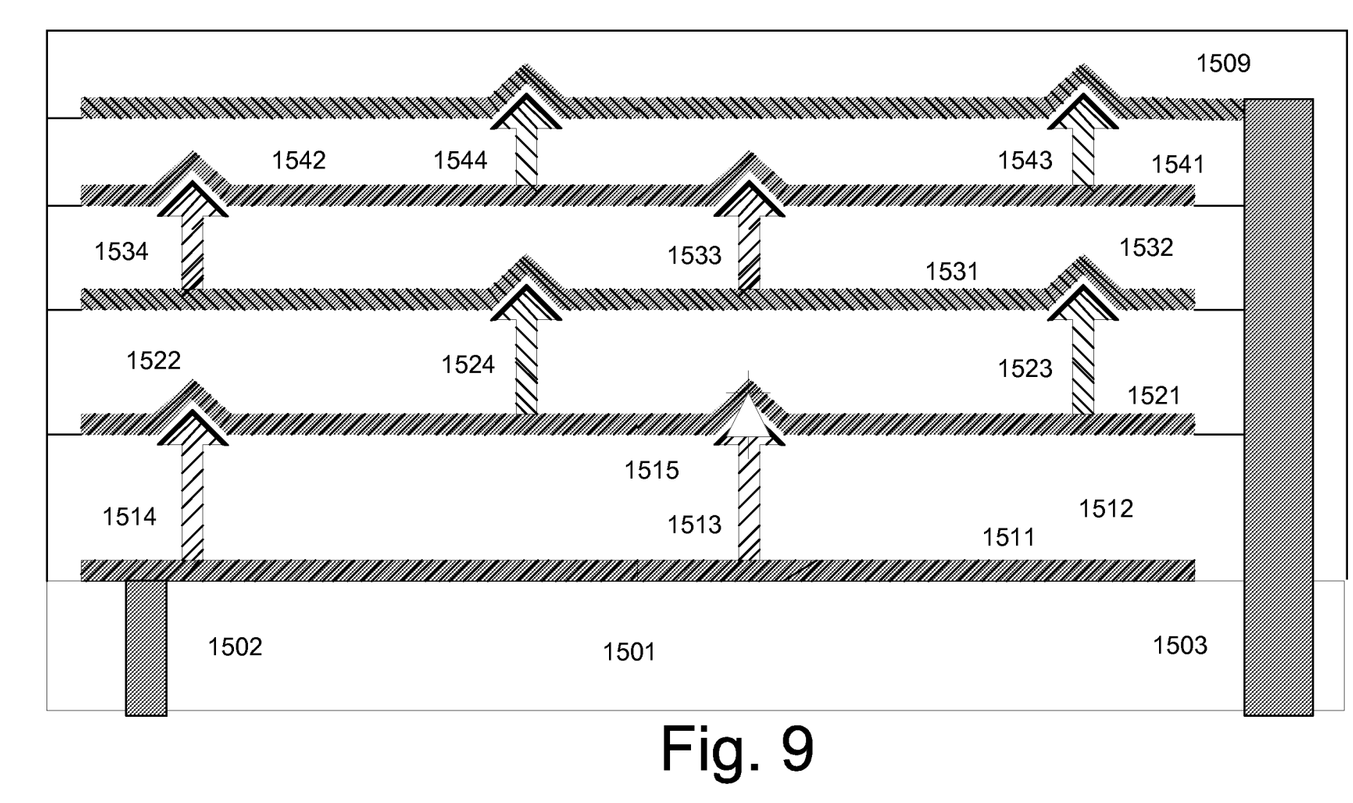
FIG. 9 depicts simplified rectenna based converters.

In certain embodiments rectenna based converters are utilized within the waveguide. The converter consists of a plurality of thin, conducting elements being nearly an integral number of half-wavelengths long, suspended between two dissimilar conductors. FIG. 9 depicts a stacked array of dielectric layers 1512, 1522, 1532, 1542 between conducting layers 1511, 1521, 1531, 1541 where the layer thicknesses are optimized for a succession of different detection frequencies. Antennas 1513, 1514, 1523, 1524, 1533, 1534, 1543, 1544 are tuned to capture a photon as a resonance of the antennas. At least one connection between each of the conducting elements and the conducting layers forms a rectifying junction 1515. The arrangement is placed on substrate 1501 with DC electrical contacts 1502 and 1503. Optional passivation layer 1509 at least partially encloses the converter.

Solar radiation comprises a broad range of frequencies, and thus is commonly referred to as polychromatic. In the present specification the terms radiant energy, solar energy, and light are used interchangeably unless inherently clear otherwise. Those terms relates to energy ranging from the UV to the IR and beyond into the EHF range, regardless of the source, and are not limited to the visible light or to energy incident directly or indirectly from the sun.

It is further noted that the arrow angles and dimensions in the drawing are provided primarily for clarity only and often do not represent the actual angle of reflected waves.

More complicated waveguides are readily considered having multiple dielectric layers between conductors and are well known in the literature. Similarly waveguides formed between multiple layers of lower dielectric constant are also well known and the invention extends thereto.

It should be noted that the strict stationary resonant condition can never be reached within a waveguide since, as the energy velocity approaches zero the time scale extends until leakage and loss conditions become dominant. As used in the present application, stationary resonance condition encompasses all conditions beyond which a guided wave cannot pass due to changes in the local waveguide cutoff frequency.

It will be appreciated that the invention is not limited to what has been described hereinabove merely by way of example. While there have been described what are at present considered to be the preferred embodiments of this invention, it will be obvious to those skilled in the art that various other embodiments, changes, and modifications may be made therein without departing from the spirit or scope of this invention and that it is, therefore, aimed to cover all such changes and modifications as fall within the true spirit and scope of the invention, for which letters patent is applied.

We claim:

1. A layered waveguide stack radiant energy converter array comprising:
   a plurality of superposed waveguides, each waveguide comprising a core layer having a radiant energy converter disposed therein, and two conductive cladding layers disposed on opposing sides of the core layer, the conductive layers being electrically coupled to the converter and acting as charge carriers for it;
   each waveguide having at least one inlet for passage of radiant energy therethrough, the inlet extending between the cladding layers, such that radiant energy entering the waveguide impinges on at least two layers of the waveguide, the inlet further defining a minimum cutoff frequency for the energy to propagate in the waveguide.

2. A waveguide stack as claimed in claim 1, wherein at least one converter comprises an electron donor region and an electron acceptor region.

3. A waveguide stack as claimed in claim 2, further comprising an intrinsic layer disposed between the electron donor region and the electron acceptor region.

4. A waveguide stack as claimed in claim 2 wherein a first converter disposed in a first waveguide among the superposed waveguides has differing energy bandgap than a second converter disposed in a second waveguide among the superposed waveguides.

5. A waveguide stack as claimed in claim 2, wherein the converter disposed within at least one of the plurality of superposed waveguides has an energy bandgap level at least 1% higher than the photon energy level corresponding to the cutoff frequency of the at least one waveguide.

6. A waveguide stack as claimed in claim 2 wherein the core of at least one of the plurality of superposed waveguides comprises a region of transparent conductor disposed between the electron donor region and the cladding, and a region of transparent conductor disposed between the electron acceptor region and the cladding.

7. A waveguide stack as claimed in claim 2, wherein the converter disposed in at least one of the superposed waveguides is selected from among the group consisting of at least one light source, at least one light emitter, at least one light modulator, at least one light sensor, at least one inorganic photovoltaic converter, at least one organic photovoltaic converter, at least one quantum-dot-based converter, at least one CCD converter, at least one CMOS converter, at least one LED, at least one OLED, at least one LCD, at least one phototransistor photodiode, at least one diode, at least one electroluminescent device, at least one fluorescent device, at least one gas discharge device, at least one electrochemical converter, and any combination thereof.

8. A waveguide stack as claimed in claim 2 wherein at least one first converter is an electricity-to-radiant-energy converter, and at least one second converter is a radiant-energy-to-electricity converter.

9. A waveguide stack as claimed in claim 2, further comprising an insulating layer disposed between at least two of the plurality of superposed waveguides.

10. A layered waveguide stack as claimed in claim 2 further comprising a plurality of dispersive structures embedded within the stack, for receiving radiant energy substantially parallel to the surface of the stack, dispersing the incoming energy to an angle relative to the normal of the stack surface, and emitting the energy in such fashion that it is spatially separated into a plurality of spectral components.

11. A layered waveguide stack as claimed in claim 10, wherein at least two of the plurality of spectral components impinge on the respective inlets of at least two of the plurality of superposed waveguides.

12. A layered waveguide stack as claimed in claim 10, wherein each waveguide having an inlet corresponding with the refracting structures.

13. A layered waveguide stack radiant energy converter array comprising:
a plurality of superposed waveguides, each waveguide comprising a core layer having a plurality of radiant energy converters disposed therein, and two cladding layers disposed on opposing sides of the core;
each waveguide having an inlet for passage of radiant energy therethrough, the inlet extending between the cladding layers, such that radiant energy entering the waveguide impinges on at least two layers of the waveguide.

14. A layered waveguide stack as claimed in claim 13, further comprising wiring to provide electrical communication with the plurality of converters disposed in the core.

15. A layered waveguide stack as claimed in claim 13, wherein a plurality of dispersive structures embedded within the stack for receiving radiant energy substantially parallel to the surface of the stack, dispersing the incoming energy to an angle relative to the normal of the stack surface, and emitting the energy in such fashion that it is spatially separated into a plurality of spectral components, wherein each of the plurality of dispersive structures has at least one converter associated therewith, and receiving a spectral component of the energy impinging thereupon.

16. A layered waveguide as claimed in claim 13, wherein each of the plurality of dispersive structures has at least two converters associated therewith, the converters being disposed at an angle to each other.

17. A layered waveguide stack radiant energy converter array comprising:
a plurality of superposed waveguides, each waveguide comprising a core layer having a plurality of radiant energy converters disposed therein, and two cladding layers disposed on opposing sides of the core;
at least one of the plurality of converters being an electricity-to-radiant-energy converter,
each waveguide having an outlet for passage of radiant energy therethrough, the outlet extending between the cladding layers; and
a plurality of energy combiners embedded within the stack for receiving radiant energy from at least one of the converters and for combining the incoming energy toward a substantially normal angle to the stack surface;
wherein each of the plurality of combiners has at least one converter associated therewith.

18. A layered waveguide as claimed in claim 17, further comprising wiring to provide electrical communication with the plurality of converters disposed in the core.

19. A layered waveguide as claimed in claim 17 wherein at least one of the plurality of combiners has at least two converters associated therewith, the converters being disposed at an angle to each other.

20. A layered waveguide stack as claimed in claim 19, wherein each of the two converters associated with the combiner are fed a different signal.

* * * * *